(12) United States Patent
Rieve et al.

(10) Patent No.: US 7,382,034 B2
(45) Date of Patent: Jun. 3, 2008

(54) OPTOELECTRONIC COMPONENT HAVING A CONDUCTIVE CONTACT STRUCTURE

(75) Inventors: Peter Rieve, Windeck-Dattenfeld (DE); Marcus Walder, Wipperfürth (DE); Konstantin Seibel, Siegen (DE); Jens Prima, Gehrde (DE); Reinhard Ronneberger, Dresden (DE); Markus Scholz, Kreuztal Krombach (DE); Tarek Lulé, Dresden (DE)

(73) Assignee: STMicroelectronics NV, Amsterdam (NL)

( * ) Notice: Subject to any disclaimer, the term of this patent is extended or adjusted under 35 U.S.C. 154(b) by 199 days.

(21) Appl. No.: 10/477,913

(22) PCT Filed: May 15, 2002

(86) PCT No.: PCT/EP02/05336

§ 371 (c)(1),
(2), (4) Date: Feb. 14, 2005

(87) PCT Pub. No.: WO02/093653

PCT Pub. Date: Nov. 21, 2002

(65) Prior Publication Data

US 2006/0249762 A1    Nov. 9, 2006

(30) Foreign Application Priority Data

| May 16, 2001 | (DE) | ............................. 101 23 871 |
| Nov. 15, 2001 | (DE) | ............................. 101 55 816 |
| Nov. 15, 2001 | (DE) | ............................. 101 55 817 |
| Dec. 6, 2001 | (DE) | ............................. 101 59 994 |

(51) Int. Cl.
*H01L 31/00* (2006.01)

(52) U.S. Cl. ............... 257/443; 257/428; 257/431; 257/E27.122; 438/48; 438/54; 438/69

(58) Field of Classification Search ............... None
See application file for complete search history.

(56) References Cited

U.S. PATENT DOCUMENTS

| 4,788,582 | A | 11/1988 | Yamamoto et al. |
| 5,936,261 | A * | 8/1999 | Ma et al. ................. 257/59 |
| 6,018,187 | A | 1/2000 | Theil et al. |
| 6,670,599 | B2 * | 12/2003 | Wagner et al. ......... 250/214.1 |

OTHER PUBLICATIONS

International Search Report from corresponding International Application No. PCT/EP02/05336, filed May 15, 2002.

(Continued)

*Primary Examiner*—A. Sefer
*Assistant Examiner*—Scott R Wilson
(74) *Attorney, Agent, or Firm*—Lisa K. Jorgenson; James H. Morris; Wolf, Greenfield & Sacks, P.C.

(57) ABSTRACT

The invention relates to an optoelectronic component for converting electromagnetic radiation into an intensity-dependent photoelectric current. The component includes one substrate which is formed especially according to CMOS technology. The substrate has an integrated semiconductor structure and an optically active thin layer structure which is situated upstream in the direction of light incidence. The structure includes a layer of a transparent conductive material and at least one layer of semiconductor material, which are arranged on an isolating layer, inside which connection means are provided for establishing a connection between the optically active thin layer structure and the integrated semiconductor structure arranged on the substrate. The aim of the invention is to develop one such optoelectronic component in such a way that the electrical connection between the layer of transparent conductive material and an electrical potential connection can be established in a technically simple manner. To this end, the layer of transparent conductive material can be connected to the potential connection arranged outside the pixel arrangement by means of an additional conductive structure formed on the substrate.

21 Claims, 8 Drawing Sheets

OTHER PUBLICATIONS

Rieve, P. et al., *a-Si:H Color Imagers and Colorimetry*, Journal of Non-Crystalline Solids 266-269 (2000) pp. 1168-1172.

Theil, Jeremy A., et al., *Hydrogenated Amorphous Silicon Photodiode Technology for Advanced CMOS Avtive Pixel Sensor Imagers*, Mat. Res. Soc. Symp. Proc. Vol. 609 © 2000 Materials Research Society, pp. A14.3.1-A14.3.6.

Schneider, Bernd et al., *Image Sensors in TFA (thin Film on ASIC) Technology*, Handbook of Computer Vision and Applications, vol. 1, Sensors an Imaging, copyright 1999, pp. 237-270.

* cited by examiner

OPTOELECTRONIC COMPONENT HAVING A CONDUCTIVE CONTACT STRUCTURE

BACKGROUND OF THE INVENTION

1. Field of the Invention

This invention relates to an optoelectronic component for converting electromagnetic radiation into an intensity-dependent photocurrent comprising a substrate, especially one formed according to CMOS technology, with an integrated semiconductor structure (ASIC) and an optically active thin layer structure situated upstream in the direction of light incidence, which comprises a layer of a transparent conductive material and at least one layer of semiconductor material, which are arranged on an isolating layer, inside which connection means are provided for establishing a connection between the optically active thin layer structure and the integrated semiconductor structure arranged on the substrate, wherein an arrangement of respective spatially adjacent image elements (pixels) is formed in the horizontal plane of the component, each having individual contacts on the back, and whose front contacts are together formed by the layer of transparent, conductive material.

2. Discussion of the Related Art

An optoelectronic component of the described kind is known from B. Schneider, P. Rieve, M. Böhm, Image Sensors in TFA (Thin Film on ASIC) Technology, ed. B. Jähne, H. Hausecker, P. Geißler, Handbook of Computer Vision and Applications, pp. 237-270, Academic Press, San Diego, 1999).

An optoelectronic component of this kind consists of a matrix-organized or linear arrangement of image points, so-called "pixels." The electronic circuits for operating the component, i.e., the pixel electronics, peripheral electronics or system electronics, are usually realized using CMOS-based silicon technology, and form an application-specific integrated circuit (ASIC). Separated from the above by an isolating layer and connected to the above by corresponding electrical contacts, a multi-layer arrangement is vertically situated on the ASIC in the form of a photodiode that converts electromagnetic radiation into an intensity-dependent photocurrent. This photocurrent is relayed to specific contacts of the underlying pixel electronics present in each pixel.

According to other prior art (J. A. Theil, M. Cao, G. Kooi, G. W. Ray, W. Greene, J. Lin, A J. Budrys, U. Yoon, S. Ma, H. Stork, Hydrogenated Amorphous Silicon Photodiode Technology for Advanced CMOS Active Pixel Sensor Imagers, MRS Symposium Proceedings, Vol. 609, 2000), the photodiode is a pin-configuration based on amorphous silicon, i.e., a sequence of a p-conductive, an intrinsically conductive (intrinsic) and an n-conductive amorphous silicon layer. The n-layer normally forms the lowermost layer facing the ASIC. The electrical contacts are formed on this side facing the ASIC, e.g., by a metal layer, while contacting on the side facing the direction of light incidence usually takes place via a transparent and conductive layer. Component structures other than the mentioned pin-photodiode are also possible, e.g., Schottky photodiodes, in which an intrinsic semiconductor layer is brought into contact with a suitable metal (e.g., chromium, platinum, palladium, silver), so that the metal-semiconductor transition forms a Schottky photodiode. Also known are detector structures with a controllable spectral sensitivity (P. Rieve, M. Sommer, M. Wagner, K. Seibel, M. Bohm, a-Si:H Color Imagers and Colorimetry, Journal of Non-Crystalline Solids, Vol. 266-269, pp. 1168-1172, 2000). This basic structure of a TFA image sensor can be expanded further by additional layers situated upstream in the direction of light incidence, for example via color filter layers (e.g., Bayer pattern, U.S. Pat. No. 3,971,065).

Optoelectronic components of the kind known from prior art have a back contact for each image element (pixel) inside the arrangement of spatially adjacent image elements, which is connected with the respective pixel electronics by means of a contact structure allocated to the individual pixel. By contrast, the front contact (located upstream in the direction of light incidence) consists of transparent, conductive material, the so-called TCO layer, extending through the layer for all image elements. This layer can consist of indium-tin-oxide (ITO) or aluminum-doped or aluminum-oxide doped zinc oxide ($ZnO:Al$ or $ZnO:Al_2O_3$), for example, which are applied by means of the cathode sputtering process (sputtering process). Both the electrical conductivity and the optical transmission of such TCO layers depend greatly on the oxygen content of the layer, and hence also on the oxygen content of the plasma during deposition. Metering in oxygen in an efficient manner during the sputtering process (reactive sputtering) makes it possible to modify the electrical and optical layer parameters within broad limits, and to optimize conductivity and transmission.

In prior art, one way of connecting the layer consisting of transparent, conductive material with an electrical potential tap is to apply a connecting wire connected with a bonding pad to the layer in a bonding process. The disadvantage to this process involving the use of a connecting wire in a bonding process is that it reduces the durability or adhesion of the bonding wire to the layer.

In another variant, the layer of transparent, conductive material is guided laterally down on a contact structure of the ASIC. However, this necessitates an additional photolithographic structuring step, since the silicon layers and contact layer must be structured with various masks, resulting in a higher production outlay. Furthermore, a disadvantage to this known solution is the danger that the contact layer might be torn off at the edge of the photodiode.

SUMMARY OF THE INVENTION

Proceeding from the above, an object of this invention is to further develop an optoelectronic component of the kind mentioned at the outset in such a way that the electrical connection between the layer of transparent conductive material and the electrical potential tap can be established in a simple manner in terms of production.

This object is achieved according to the invention by virtue of the fact that the layer of transparent conductive material can be connected to a potential tap arranged outside the image element arrangement by means of an additional conductive structure formed on the substrate.

The invention is characterized by the fact that the connection between the electrical potential tap and the layer of transparent, conductive material is generated via an additional, contact bridge-forming, conductive structure. Given the selection of suitable materials, this structure can be generated in conjunction with the production steps for manufacturing the optically active layers through suitable structuring. This eliminates the need for an additional photolithographic structuring step of the kind encountered in prior art, or a higher functionality is achieved given the same number of structuring steps.

A first variant of the invention provides that the additional structure be a lightproof layer that at least partially covers the image element arrangement.

The use of such a conductive layer simultaneously makes it possible to contact the transparent, conductive layer from the surface of the image element arrangement at the ASIC level instead of the lateral contacting of the transparent, conductive layer via the transparent, conductive oxide itself as described in prior art, which leads to a reduction in contact resistance. Therefore, this yields a low-resistance connection between the layer forming the front electrode and the laterally adjacent contact structure. At the same time, this makes it possible to realize pixels or pixel areas (lines or columns) that are shielded relative to the incident optical radiation. This means that the arrangement incorporates so-called "dark pixels", wherein the dark signals resulting from these pixels are used as reference signals, e.g., which are subtracted from the actual image signals during sensor operation in order to eliminate the dark current affecting the photodiodes and its temperature dependence. In addition, the dark signals are used so that differences in column amplifier gains can be offset within the framework of correction processes. From a production standpoint, such dark pixels are realized by applying to the photoactive layers of the optoelectronic component a lightproof layer made of a suitable material, structured in such a way as to cover the areas to be darkened, while being removed again over the photoactive regions.

Chromium has proven to be an advantageous material for the metal layer. As an alternative, the lightproof layer can also comprises a nontransparent polymer.

In a first preferred exemplary embodiment for the first variant of the invention, it is provided with respect to the position of the metal layer that the lightproof layer be arranged between the layer of transparent, conductive material and the at least one layer of semiconductor material. After the photodiode back contacts have been applied and structured, the semiconductor layer system, e.g., comprised of amorphous silicon, is in this case initially applied using the PECVD (plasma enhanced chemical vapor deposition) process, and then photolithographically structured. The light-shielding and contacting metal layer coating is then applied, e.g., using the sputtering or vapor deposition process. This metal layer is now also photolithographically structured, so that it projects over the edge of the photoactive surface of the image element arrangement, and establishes the contact with a metal electrode of the ASIC provided for this purpose. The transparent, conductive layer (TCO), e.g., comprising aluminum-doped zinc oxide, aluminum oxide-doped zinc oxide (ITO), is then applied, and structured so as to cover the entire photoactive surface of the optoelectronic components, if necessary including the areas shielded by the metal, and be in contact with the light-shielding metal layer.

As an alternative, however, the lightproof layer can also be situated upstream from the layer of transparent, conductive material in the direction of light incidence. In this case, the semiconductor layer system, e.g., comprising amorphous silicon, along with the TCO layer deposited thereupon can be structured in a single photolithography step. The light-shielding and contacting metal layer is then applied and structured as above. Consequently, this variant requires one lithography step less than the one mentioned first, but does necessitate an etching process with which the metal layer can be selectively removed from the TCO material.

For example, if even more absorbing layers are added in the case of sensors equipped with a color filter array, e.g., three conventionally used color filters are stacked one atop the other, the light-shielding characteristics can be further improved relative to the dark pixels.

In a second variant of the invention, the additional structure is realized by a semiconductor structure that constitutes a diode operated in the conducting direction, and is formed on the substrate outside of the image element arrangement.

Provided in addition to the image element arrangement, i.e., the photoactive matrix, within the framework of this variant is another structure that establishes an electrically conductive connection of the TCO layer with the electrical potential tap. This electrical potential tap (terminal electrode) is preferably made out of the same material as the back electrodes of the individual image elements, and can also be structured together with the latter. As an alternative, the terminal electrode can be realized using a material other than that for the back electrodes of the image elements. The terminal electrode is connected with an external bond pad by means of corresponding contact vias, printed conductors and, if needed, other circuit components (e.g., protective diodes). The semiconductor layers forming the photodiode and comprising amorphous or microcrystalline silicon, or alloys thereof, along with the transparent and conductive front electrode are led past the photoactive zone of the image element arrangement to beyond the terminal electrode, so that the specified diode structure forms between the terminal electrode and the TCO front electrode. This diode structure is operated in the conducting direction based on suitable contacting, so that it acts as a nonlinear resistor.

If the diode is designed as a pin diode according to an embodiment of this variant of the invention, a negative potential applied to the terminal electrode can be conveyed via the diode operated in the conducting direction to the front electrode, allowing for a current-dependent voltage drop.

However, care must be taken here to isolate the lower n-layer, which has a comparably high conductivity as a doped layer, from the pixel back electrodes. In the case of a Schottky diode structure, this break is unnecessary, since the intrinsic layer has only a very slight conductivity. Possible materials for the terminal electrode include chromium or chromium alloys. The size of the terminal electrode must be dimensioned in such a way that the entire photocurrent of the photoactive sensor surface can be carried over the diode under maximum illumination.

As an alternative, an isolating zone that separates the semiconductor structure 6, 7, 8, but not the TCO layer 9, can be inserted between the image element arrangement B and the diode structure P.

A third variant of the invention elaborates upon the aforementioned variant, and utilizes the same structural design. However, the application and structuring of the TCO layer is additionally followed by a local fusing of the layers forming the diode, e.g., by means of a laser light pulse, thereby achieving a low-resistance connection between the terminal electrode and the TCO front contact by way of the silicon layers. The advantage to this low-resistance connection brought about via local fusing is that the voltage drop over the contact structure is lower given an identical overall photocurrent, and that a smaller contact surface is required.

In a fourth variant of the invention, the additional structure is a multi-layer structure comprising two interacting materials, in particular aluminum and silicon. This advantageous further development provides that a material be selected for the terminal electrode that results in interactions with silicon at elevated temperatures. For example, such interactions are known for aluminum and silicon if they are brought into contact (M. Shahidul Haque, H. A. Naseem, W. D. Brown, Interaction of aluminum with hydrogenated amorphous silicon at low temperatures, Journal of Applied Physics, Vol. 75 (8), pp. 3928-3935, 1994). An interdiffusion of aluminum and silicon takes place during exposure to a high temperature (starting at approx. 150° C.), resulting in a local short circuit of the diode. Given suitable process management, this effect already arises during the deposition of amorphous or microcrystalline silicon layers, or during additional tempering steps in the manufacturing process. In this case, the metal electrode can comprise the uppermost metallic coatings of the ASIC, for which aluminum is generally used. In this way, the desired low-resistance connection is achieved between the terminal and front electrode via the amorphous or microcrystalline silicon layers, even without local fusing, and hence without an additional procedural step.

BRIEF DESCRIPTION OF THE DRAWINGS

The invention will be explained in greater detail below based on the drawings, in which.

DETAILED DESCRIPTION

Figure 1:
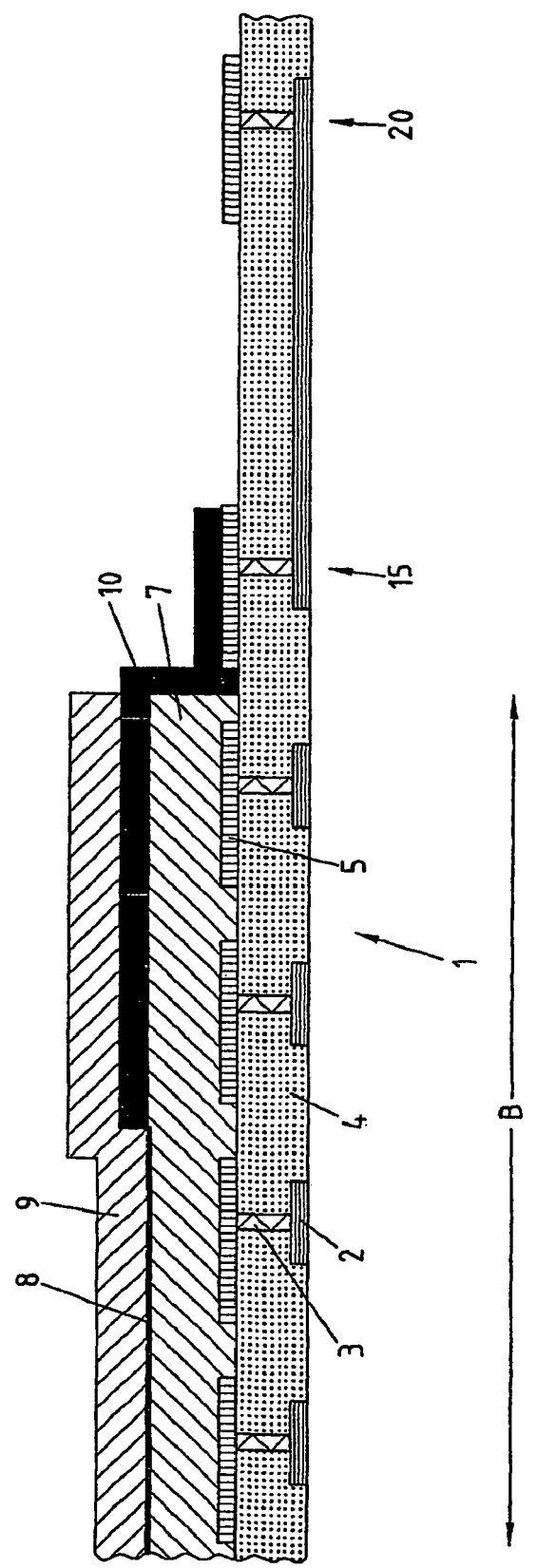
FIG. 1 is a first exemplary embodiment of a first variant of the invention.

The optoelectronic component shown on FIG. 1 comprises a substrate 1, in particular a silicon substrate, whose surface bears correspondingly integrated circuits. These circuits are realized in CMOS technology, and the resultant circuit is designated as an application-specific integrated circuit (ASIC). The ASIC is contacted with an optical thin-layer structure yet to be described comprising layers 5, 7, 8, 9 using an isolating layer 4 located on the surface of the ASIC, which accommodates metal coatings 2, which extend essentially horizontally, and are each electrically connected with a metal contact 5 by means of vias 3. This produces a direct electrical connection between the desired positions on the surface of the integrated circuit and a plane with metal contacts 5, which represent the lowermost layer of the optical structure facing the ASIC. The left four units shown on FIG. 1, each comprising metal coating 2, via 3 and metal contact 5, are component, and form an arrangement B of image elements. Each unit comprised of metal coating 2, via 3 and metal contact 5 is here allocated to a single pixel within the image element arrangement B. Located outside the image element arrangement B is another unit comprised of metal coating 2, via 3 and metal contact 5, which forms a terminal electrode 15. The terminal electrode 15 is electrically connected with an external bond pad 20 lying outside the structure by a lengthened metal coating region.

Each of the metal layer contacts 5 serving as base terminals for the individual pixel contacts is covered by an intrinsic amorphous silicon layer 7, which in turn carries a p-type doped amorphous silicon layer 8. The entire structure configured in this way is covered by a layer of conductive, transparent oxide (TCO) 9, which constitutes the layer of the entire structure situated upstream in the direction of light incidence. Located between the uppermost amorphous silicon layer 8 and the layer comprising a conductive, transparent oxide 9 is a metal layer 10, which laterally covers individual image elements on the one hand, and extends up until the terminal electrode 15 on the other. This layer is fabricated after the metal contacts 5 have been applied and structured by initially applying the layer system comprising the amorphous silicon layers 7 and 8 using the PECVD process, and then subjecting it to photolithographic structuring. This is followed by coating with the metal layer 10, for example using the sputtering or vapor deposition process. This metal layer 10 is also photolithographically structured, so that it extends over the edge of the photoactive surface (image element area B) and establishes the contact with the terminal electrode 15. Finally, the TCO layer 9 is applied and structured, so that it covers the entire photoactive surface of the image sensor, and is in contact with the light-shielding metal layer 10.

Figure 2:
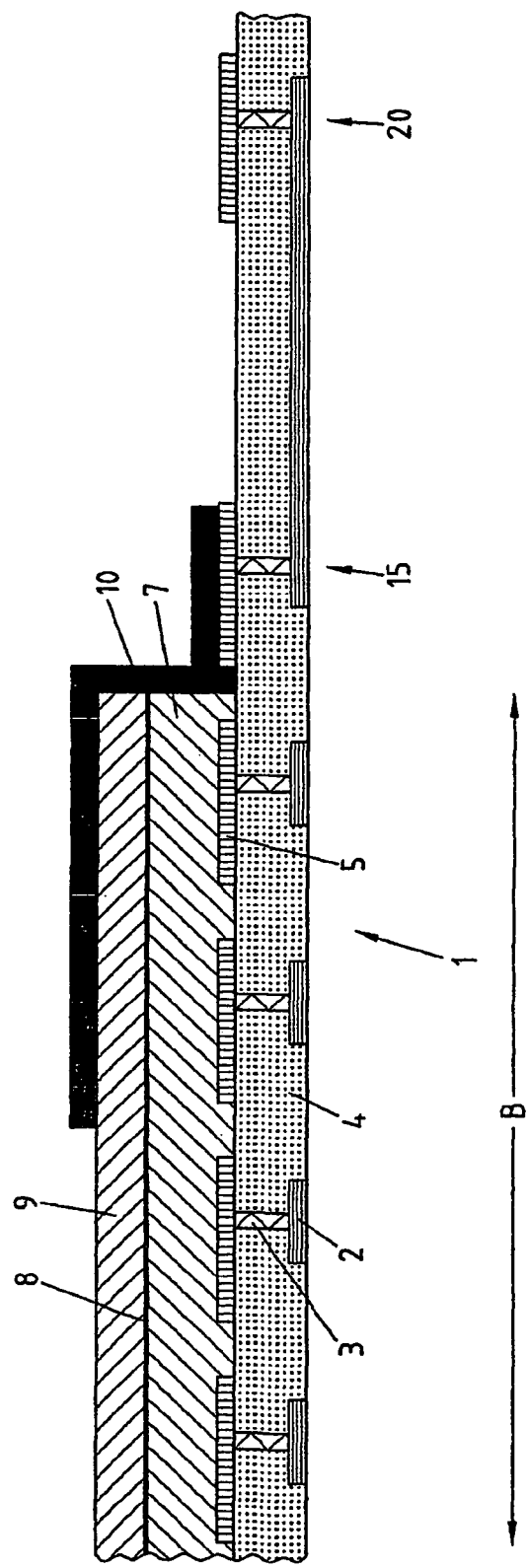
FIG. 2 is a second exemplary embodiment of a first variant of the invention.

The second exemplary embodiment of the first variant of the invention shown on FIG. 2 differs from that depicted on FIG. 1 only in that the metal layer 10 is situated above the transparent, conductive layer 9 viewed in the direction of light incidence. In this case, the layer system can be fabricated by structuring the layers of amorphous silicon 7 and 8 along with the TCO layer 9 deposited thereupon in a single photolithography step, after which the metal layer 10 can be applied. Therefore, this variant requires one less lithography step, but does necessitate an etching process in which the metal layer 10 is selectively removed from the TCO layer 9.

Both embodiments of the first variant of the invention share that shading the metal layer produces dark pixels, which are shielded against the incident optical radiation. The signals generated by these pixels, the so-called "dark signals", are used as reference values for correcting the acquired image signals. The dark signals are subtracted from the image signals during sensor operation, for example, in order to eliminate the dark current affecting the photodiodes and its temperature dependence.

Figure 3:
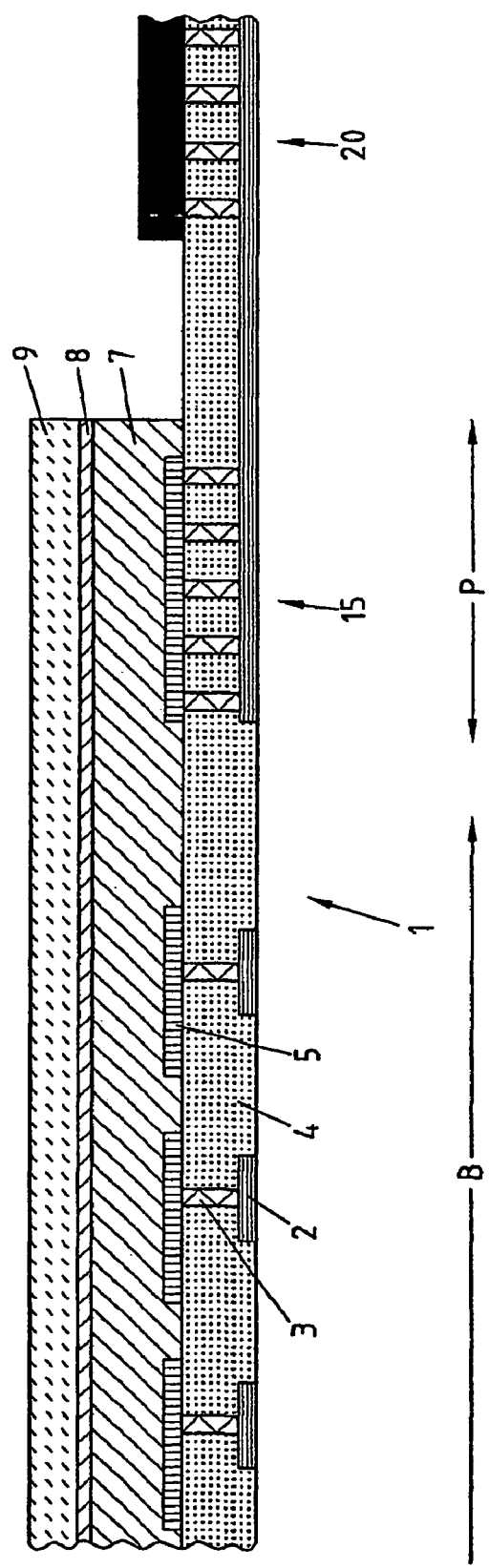
FIG. 3 is a first exemplary embodiment of a second variant of the invention.

FIG. 3 shows a first exemplary embodiment of the second variant of the invention. The structural design of the component basically reflects the exemplary embodiment described in conjunction with FIG. 1. As opposed to the configuration according to FIGS. 1 and 2, however, the thin-layer structure comprised of layers 7, 8 and 9 here extends only over the area of the terminal electrode 15. Furthermore, the terminal electrode 15 is arranged a distinctly greater distance away relative to the metal contacts allocated to the individual pixels. Otherwise, however, the terminal electrode 15 is connected with the bond pad 20 by a lengthened metal coating 2 in this exemplary embodiment as well.

In addition to the photoactive image element arrangement B, this configuration produces a diode structure P, wherein the layers forming the diode P correspond to those that also constitute the optically active structure of the image sensor. The so-called "contact diode" formed via the described geometric arrangement between the terminal electrode 15 and the TCO layer 9 is operated in the conducting direction during operation by applying a negative potential to the terminal electrode, which is supplied via bond pad 20. In the exemplary embodiment shown on FIG. 3, the contact diode is designed as a Schottky diode.

Figure 4:
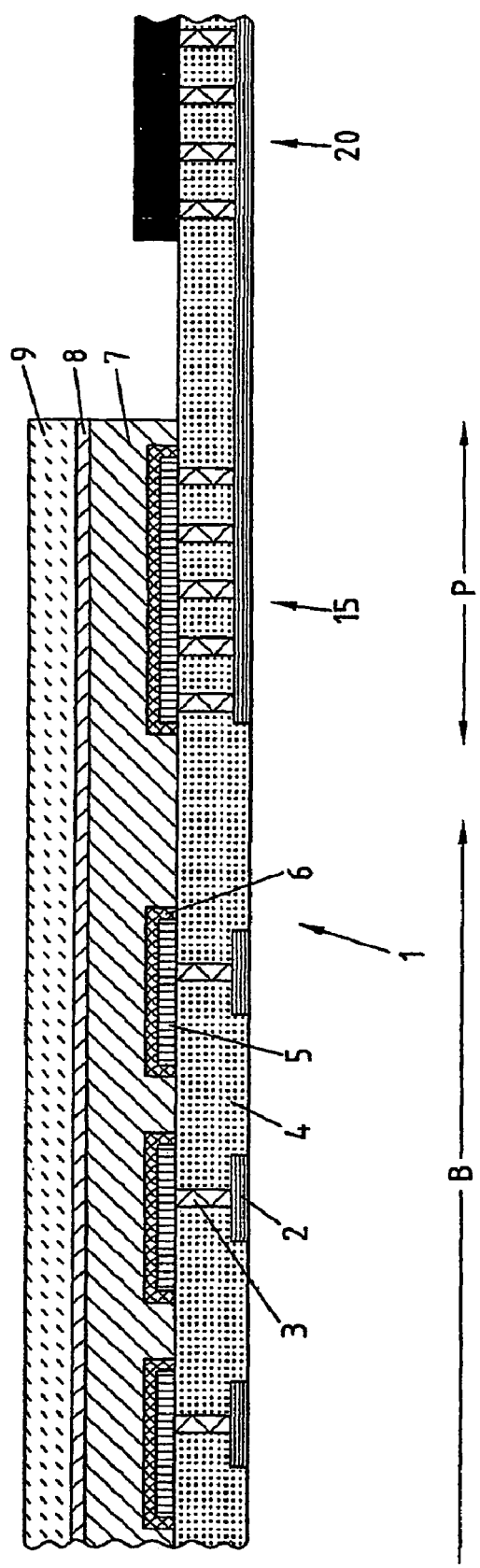
FIG. 4 is a second exemplary embodiment of a second variant of the invention.

By contrast, the second exemplary embodiment of the second variant of the invention according to FIG. 4 differs from the one depicted on FIG. 3 in that an n-doped amorphous silicon layer 6 is additionally applied to the metal contacts 5. As a result, the diode formed in area P is configured as a pin diode; otherwise, however, the structure is the same as on FIG. 3.

The depicted spatial distance between the terminal electrode 15 and the photoactive area B of the image sensor precludes a direct flow of current from the terminal electrode 15 to area B. Rather, the diode formed in area P acts as a nonlinear resistor if operated in the conducting direction, as shown.

As an alternative, the semiconductor structure between the areas B and P can be separated by inserting an additional isolator.

Further, additional ESD protective structures (not shown) can be arranged in the connection between the terminal electrode 15 and the bond pad 20 to prevent electrostatic charge effects.

Figure 5:
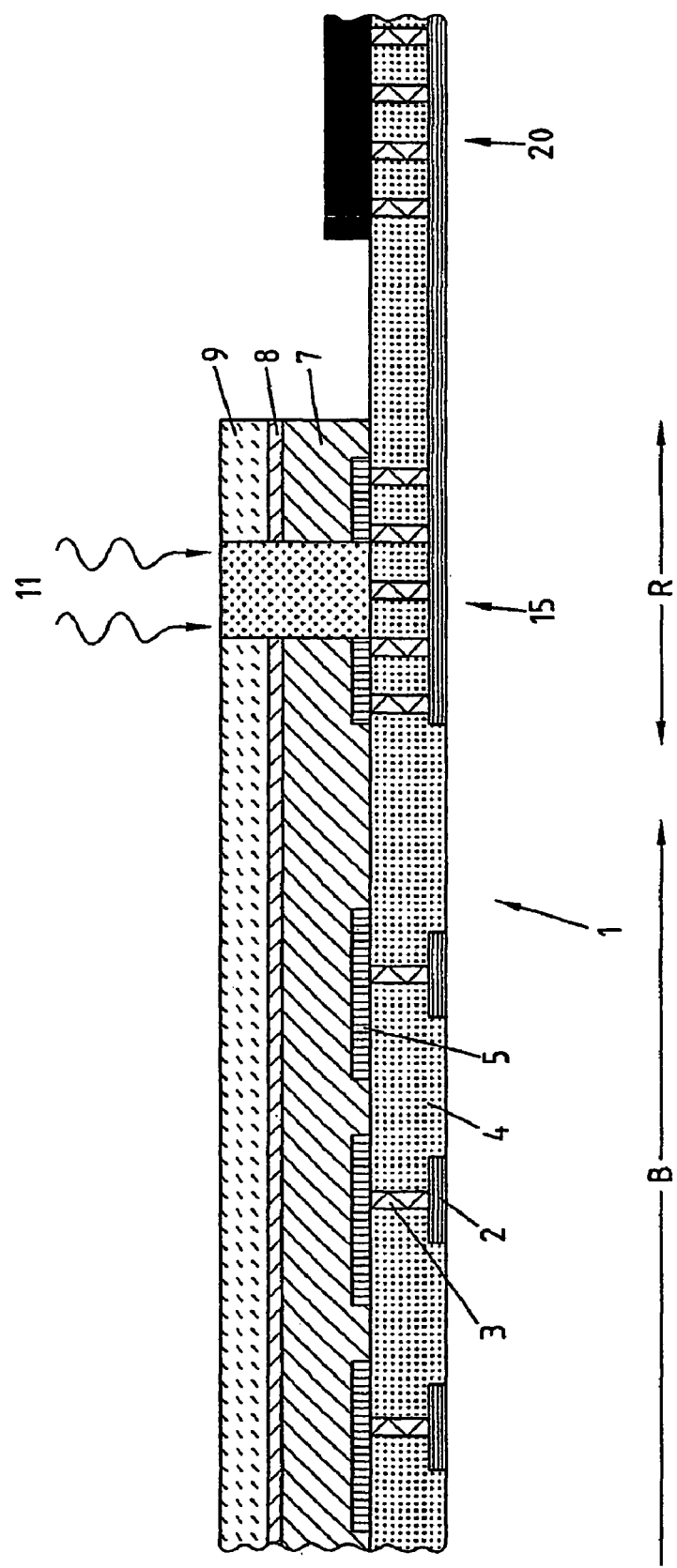
FIG. 5 is an exemplary embodiment of a third variant of the invention.

The exemplary embodiment of the third variant of the invention shown on FIG. 5 is based upon a structure of the kind described on FIG. 3 or 4. As opposed to the latter, the area of the contact diode has a melting zone 11 formed by locally fusing the thin-layer structure 5, 7, 8, 9 by means of a laser light pulse, for example, thereby yielding a low-resistance connection between the terminal electrode 15 and the TCO layer 9 via the fused silicon layers. The advantage to this is that the voltage drop over the contact structure is reduced given an identical overall photocurrent flowing through the image sensor, and that a smaller contact surface is required.

Figure 6:
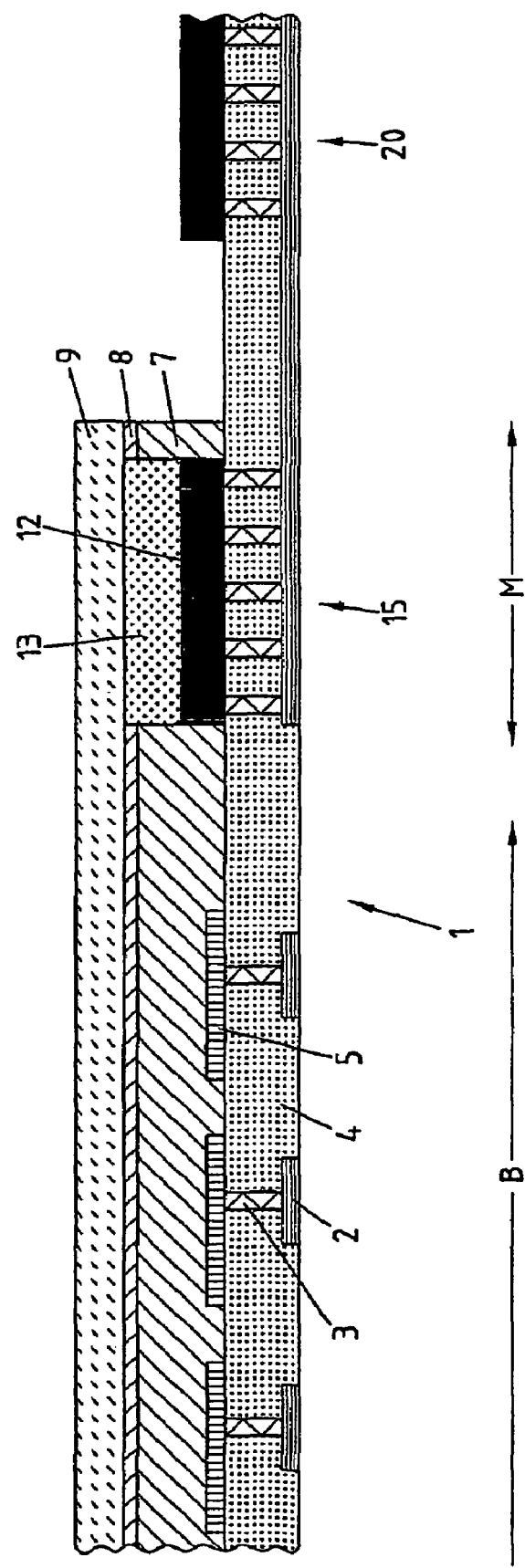
FIG. 6 is an exemplary embodiment of a fourth variant of the invention.

The exemplary embodiment according to the fourth variant of this invention described on FIG. 6 is characterized by the fact that the structure according to FIG. 3 and 4 serves as the basis for creating a structured area M in the area of the terminal electrode, which comprises a layer structure resulting from another metal layer 12 and an interdiffusion layer 13 arranged thereupon. The material used for the terminal electrode 15 is advantageously aluminum, which interacts with the overlying silicon layers 7 and 8 at an elevated temperature. This also results in a low-resistance connection in the form of the interdiffusion layer 13 between the terminal electrode 15 and the TCO layer 9 over the amorphous or microcrystalline silicon layers, specifically without local melting, and hence without an additional procedural step.

Figure 7:
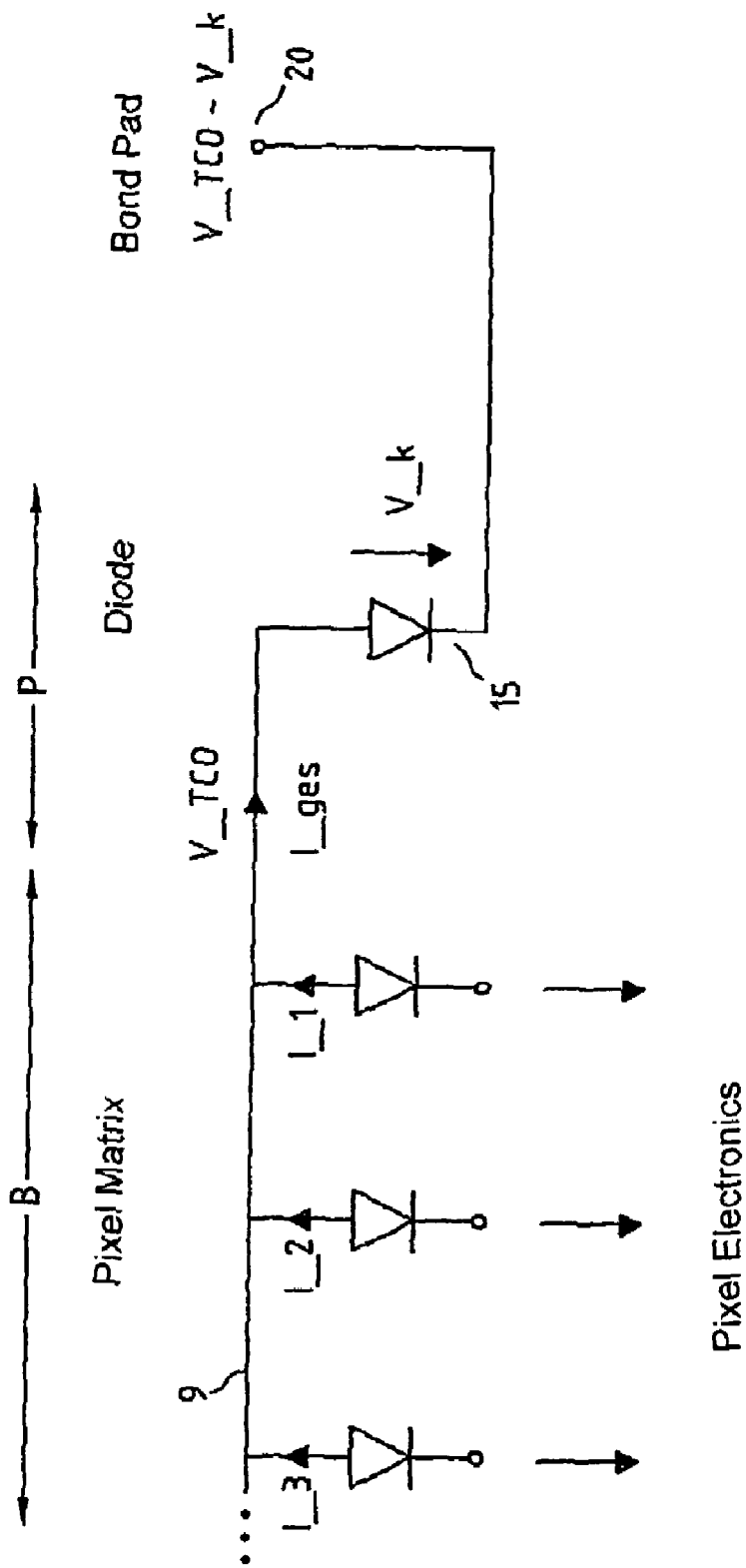
FIG. 7 is an electrical equivalent circuit diagram for a configuration according to FIG. 3 and 4.

Finally, FIG. 7 shows an electrical equivalent circuit diagram for the exemplary embodiments of the second variant of the invention. Situated in the area of the image element arrangement B are parallel connected photodiodes, operated in the non-conducting direction, which produce currents I'_1, I_2, I_3. These are carried on the shared TCO layer 9, and yield the overall photocurrent I_ges. The photocurrent I_ges flows over the layer structure acting as a diode operated in the conducting direction in the area P of FIGS. 3 and 4, finally arriving at the bond pad 20, where a voltage is applied, arising from the differential input voltage between the voltage on the TCO electrode and the voltage drop on the contact diode V_k.

Figure 8:
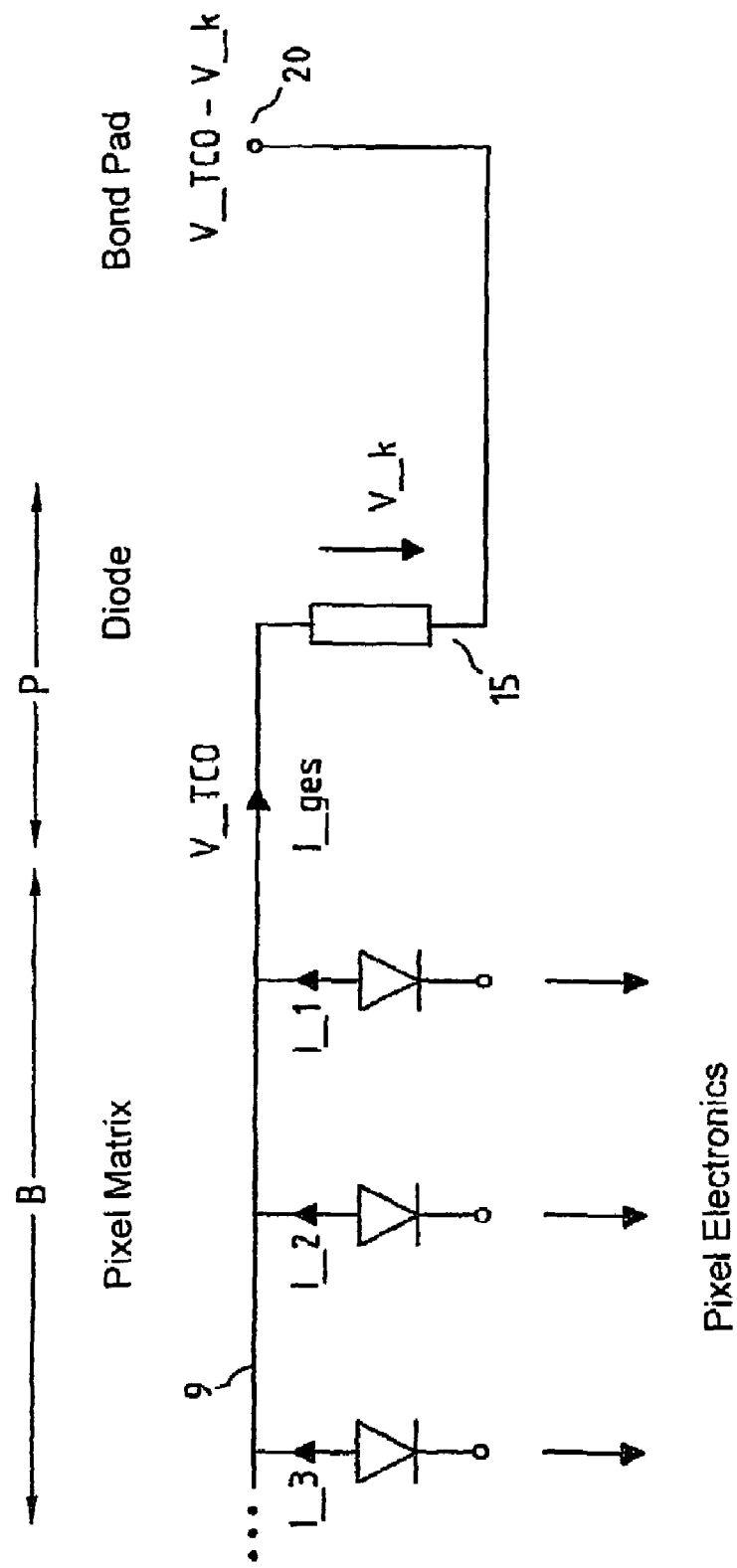
FIG. 8 is an electrical equivalent circuit diagram for a configuration according to FIG. 5 and 6.

In like manner, FIG. 8 shows the equivalent circuit diagram according to FIGS. 5 and 6, wherein the diode operated in the conducting direction is replaced by the ohmic resistance that arises in the fusing area or interdiffusion area.

Having thus described at least one illustrative embodiment of the invention, various alterations, modifications, and improvements will readily occur to those skilled in the art.

Such alterations, modifications, and improvements are intended to be within and scope of the invention. Accordingly, the foregoing description is by way of example only and is not intended as limiting. The invention is limited only as defined in the following claims and the equivalents thereto.

REFERENCE LIST

1 Substrate
2 Metal
3 Via
4 Dielectric
5 Metal contact
6 n-a-Si:H layer
7 i-a-Si:H layer
8 p-a-Si:H layer
9 TCO layer consisting of transparent, conductive material
10 Metal layer
11 Melting zone
12 Additional metal layer
13 Interdiffusion zone
15 Terminal electrode
20 Bond pad
B Image element arrangement
M Multi-layer metal-semiconductor structure
P Diode structure
R Multi-layer metal semiconductor structure

What is claimed is:

1. An optoelectronic component for converting electromagnetic radiation into an intensity-dependent photocurrent comprising
   a substrate, especially one formed according to CMOS technology, with an integrated semiconductor structure and an optically active thin layer structure situated upstream in the direction of light incidence, the optically active thin layer comprising:
   a layer of a transparent conductive material and
   at least one layer of semiconductor material, which are arranged on an isolating layer,
   inside which isolating layer connection means are provided for establishing a connection between the optically active thin layer structure and the integrated semiconductor structure arranged on the substrate,
   wherein an arrangement of respective spatially adjacent image elements is formed in the horizontal plane of the component, each having individual contacts on the back, and whose front contacts are together formed by the layer of transparent, conductive material,
   wherein the layer of transparent, conductive material is connected with a potential tap arranged outside of the image element arrangement by a conductive structure additionally formed on the substrate, the conductive structure contacting the layer of transparent, conductive material and at least one of said connection means.

2. The optoelectronic component according to claim 1, wherein the additional structure is a lightproof layer that at least partially covers the image element arrangement.

3. The optoelectronic component according to claim 2, wherein the lightproof layer is a metal layer, in particular a chromium layer.

4. The optoelectronic component according to claim 2, wherein the lightproof layer is a layer comprised of a non-transparent polymer.

5. The optoelectronic component according to claim 2, characterized in that the lightproof layer is arranged between the layer of transparent, conductive material and the at least one layer comprising semiconductor material.

6. The optoelectronic component according to claim 2, wherein the lightproof layer is situated upstream from the layer of conductive material in the direction of light incidence.

7. The optoelectronic component according to claim 1, wherein the additional structure is a semiconductor structure that forms a diode operated in the conducting direction, and is formed on the substrate outside of the image element arrangement.

8. The optoelectronic component according to claim 7, wherein the diode is a pin diode.

9. The optoelectronic component according to claim 8, wherein the n-layer of the pin diode is connected with the potential tap and isolated from the image element arrangement.

10. The optoelectronic component according to claim 7, wherein the diode is a Schottky diode.

11. The optoelectronic component according to claim 1, wherein the additional structure is a multi-layer structure locally fused in such a way as to produce a low-resistance connection between the potential tap and the layer of transparent, conductive material.

12. The optoelectronic component according to claim 1, wherein the additional structure is a multi-layer structure comprising two interacting materials, in particular aluminum and silicon.

13. The optoelectronic component according to claim 1, wherein the semiconductor material of the thin-layer structure comprises amorphous or microcrystalline silicon or alloys thereof.

14. An apparatus comprising:
an optoelectronic component comprising a transparent, conductive material formed over a plurality of image elements;
an electric potential tap; and
a conductive structure establishing an electric connection between the transparent, conductive material and the electric potential tap.

15. The apparatus of claim 14, wherein the conductive structure is a contact diode.

16. The apparatus of claim 15, wherein the contact diode is a Schottky diode.

17. The apparatus of claim 15, wherein the contact diode is a pin diode.

18. The apparatus of claim 17, wherein an n-layer of the pin diode is connected to the electric potential tap.

19. The apparatus of claim 14, wherein each of the plurality of image element comprises a diode.

20. The apparatus of claim 19, wherein the diode is a Schottky diode.

21. The apparatus of claim 19, wherein each of the image elements comprises at least one layer of semiconductor material, and the at least one layer of semiconductor material is shared between each of the at least one image elements.

* * * * *

UNITED STATES PATENT AND TRADEMARK OFFICE
CERTIFICATE OF CORRECTION

PATENT NO.        : 7,382,034 B2
APPLICATION NO.   : 10/477913
DATED             : June 3, 2008
INVENTOR(S)       : Peter Rieve et al.

It is certified that error appears in the above-identified patent and that said Letters Patent is hereby corrected as shown below:

Col 5, line 55 should read:
metal contact 5, are situated in the photoactive area of the component, and form an arrangement B of Signed and Sealed this Twelfth Day of August, 2008

JON W. DUDAS
*Director of the United States Patent and Trademark Office*